United States Patent [19]
Kahan

[11] Patent Number: 4,499,395
[45] Date of Patent: Feb. 12, 1985

[54] CUT ANGLES FOR QUARTZ CRYSTAL RESONATORS

[75] Inventor: Alfred Kahán, Brookline, Mass.

[73] Assignee: The United States of America as represented by the Secretary of the Air Force, Washington, D.C.

[21] Appl. No.: 498,336

[22] Filed: May 26, 1983

[51] Int. Cl.³ ............................................ H01L 41/08
[52] U.S. Cl. .................................................. 310/361
[58] Field of Search ................................ 310/360, 361

[56] References Cited

U.S. PATENT DOCUMENTS

| | | | |
|---|---|---|---|
| 3,826,931 | 7/1974 | Hammond | 310/361 |
| 4,079,280 | 3/1978 | Kusters et al. | 310/361 X |
| 4,124,809 | 11/1978 | Engdahl et al. | 310/361 |
| 4,126,802 | 11/1978 | Hermann | 310/361 |
| 4,306,170 | 12/1981 | Motte et al. | 310/361 |
| 4,313,071 | 1/1982 | Hermann et al. | 310/361 |

OTHER PUBLICATIONS

Kahan, A., Turnover Temperatures for Doubly Rotated Quartz, Proceedings of the 36th Annual Symposium on Frequency Control, Jun. 2-4, 1982, pp. 170-180, (1982).

Kahan, A. and Euler, F., AK-Cut Crystal Resonators, Proceedings of the 14th Precise Time and Time Interval Meeting, Dec. 2, 1982, pp. 577-591, (1982).

Handbook of Piezoelectric Crystals for Radio Equipment Designers, by Buchanan, WADC Technical Report 54-248, Dec. 1954, pp. 33-34.

*Primary Examiner*—Mark O. Budd
*Attorney, Agent, or Firm*—Donald J. Singer; William J. O'Brien

[57] ABSTRACT

The present invention concerns itself with crystallographically doubly rotated quartz orientations vibrating in the transverse c-mode with turnover temperatures which are considerably less sensitive to angular misorientation than the comparable well known AT- or BT-cuts. These crystals are arbitrarily designated as AK-cut crystals and are defined by $\phi$-angle variations between 30°–60° and $\theta$-angle variations between 12°–32°. The turnover temperatures of these resonators are between 60° C. and 200° C.

9 Claims, 20 Drawing Figures

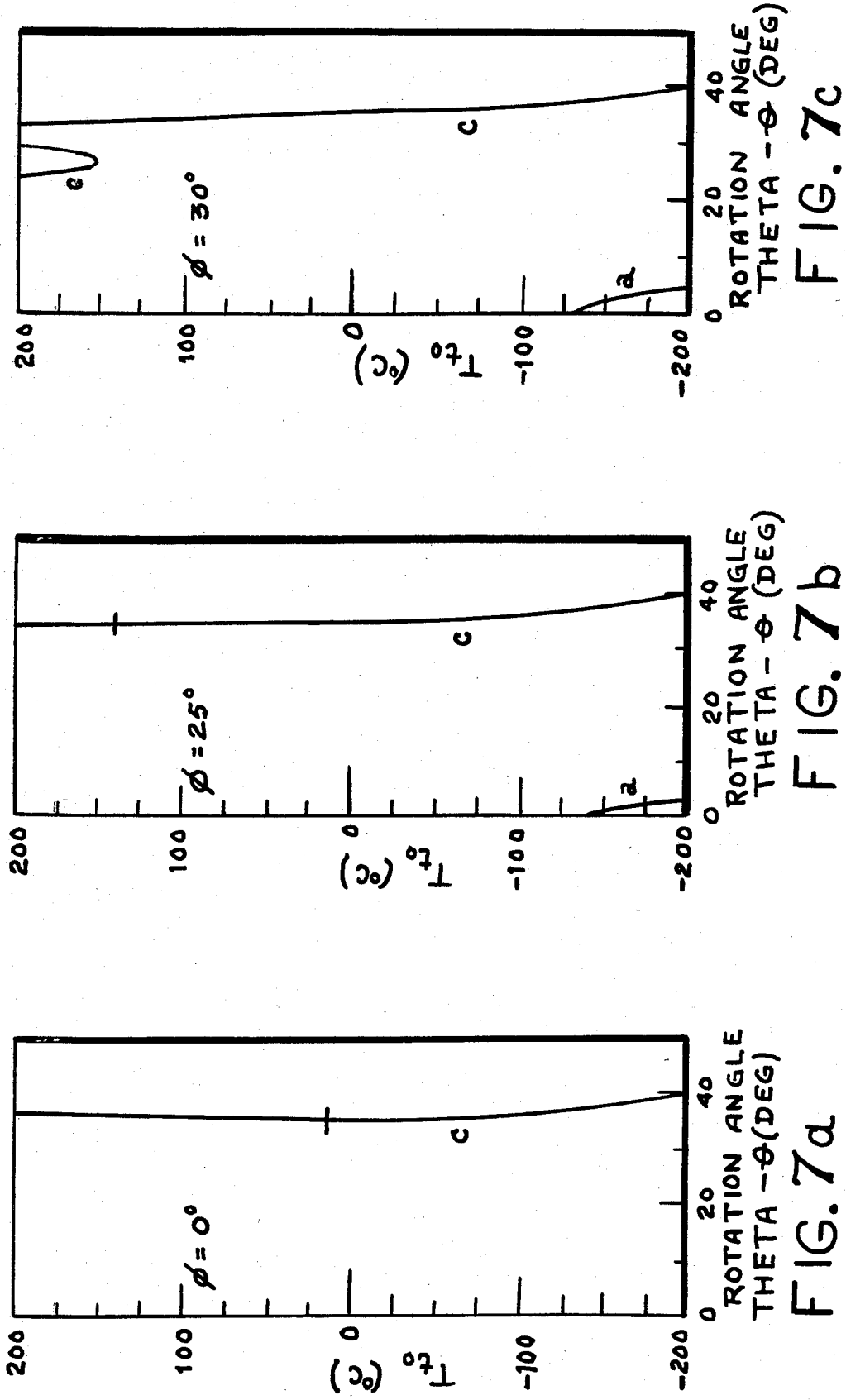

CUT ANGLES FOR QUARTZ CRYSTAL RESONATORS

STATEMENT OF GOVERNMENT INTEREST

The invention described herein may be manufactured and used by or for the Government for governmental purposes without the payment of any royalty thereon.

BACKGROUND OF THE INVENTION

This invention relates to quartz crystal resonators. In a more particular aspect, this invention concerns itself with a family of doubly rotated quartz orientations, suitable for piezoelectric crystal resonators vibrating in c-mode resonance with turnover temperatures ($T_{to}$) above 60° C.

Piezoelectric crystal resonators find utility in a wide variety of electronic applications as a means for achieving a fixed frequency standard. They also find use for the same purpose in various time-pieces, such as wrist watches. Single crystal α-quartz is the most commonly used material for piezoelectric resonators, owing to its superior mechanical, physical and chemical properties. Quartz belongs to the trigonal crystal system, and material properties are crystal orientation dependent. The most important performance parameter of a crystal oscillator is the static frequency as a function of temperature, f(T), characteristic of the device. The normalized frequency offsets as a function of temperature may exhibit a maximum and a minimum. These positions are designated as the turnover temperatures, $T_{to}$. For high stability applications, the resonator device is enclosed in a precisely controlled oven and maintained at $T_{to}$. Most military applications specify upper environmental temperatures in the 60° to 100° C. range. The crystal orientation is selected to locate $T_{to}$ several degrees above the highest anticipated environmental temperature. Owing to $T_{to}$ sensitivity to crystallographic orientation, narrow angular tolerances, in order of minutes or seconds or arc, have to be maintained throughout the resonator fabrication process. Both requirements, precise oven control and crystal orientation, affect considerably oscillator costs. Certain orientations exist which have considerably smaller f(T) sensitivities than other directions. Typical examples include the standard AT-, BT-, and SC- cuts. The singly rotated AT- and BT-cut crystals are the most widely used orientations for high stability applications. The novel doubly rotated SC-cut orientation has considerably smaller temperature coefficient of frequency than the AT-cut. However, this order of magnitude improvement in performance is at the expense of an order of magnitude reduction in allowable crystal orientation tolerances.

As a consequence, a considerable research effort has evolved in an attempt to determine other crystal cuts that are less sensitive to crystallographic orientation than the currently utilized AT-cut, BT-cut, or SC-cut crystals. This research effort culminated in the discovery that novel combinations of phi and theta ($\phi,\theta$) angular orientations or cuts exist that yield turnover temperatures of 60° C. and above, possess equivalent or better temperature-frequency characteristics than high precision AT-cut or BT-cut resonators; and, at the same time, are insensitive to crystallographic misalignments. For descriptive purposes, the novel crystal cut of this invention is referred to as the AK-cut.

SUMMARY OF THE INVENTION

In accordance with the general concept of this invention, it has been found that α-quartz crystals can be cut along crystallographic orientations that make them especially useful as piezoelectric crystal resonators capable of vibrating in c-mode resonance with turnover temperatures of 60° C. and above. The crystallographic orientations of this invention are arbitrarily designated as AK-cut crystals with angular rotations for the $\phi$-angle ranging from 30° to 60° and the $\theta$-angle ranging from 17° to 30°.

Accordingly, the primary object of this invention is to provide a novel family of α-quartz crystals having a specific combination of crystallographic orientations that make them especially suitable as piezoelectric crystal resonators for a wide variety of technical applications which require the maintenance of a standard resonance frequency as an essential operating characteristic.

Another object of this invention is to provide a novel combination of doubly rotated quartz cuts that are considerably less sensitive to crystallographic orientations than the crystal cuts utilized at the present time.

Still another object of this invention is to provide a novel series of doubly rotated crystal cuts capable of achieving turnover temperatures of 60° C. and above in piezoelectric resonators thus providing an unexpected increase in accuracy and stability at the elevated temperatures often encountered within its operational environment.

The above and still other objects and advantages of the present invention will become more readily apparent upon consideration of the following detailed description thereof when viewed in light of the accompanying drawings.

DESCRIPTION OF THE DRAWINGS

In the drawings

FIGS. 7a to 7i are graphical illustrations showing the calculated turnover temperatures as a function of ($\phi,\theta$);

DETAILED DESCRIPTION OF THE PREFERRED EMBODIMENTS

Pursuant to the above-defined objects, it has been found that an α-quartz crystal having angular rotations around the crystallographic z-axis of about 30° to 60° and around the x-axis of about 17° to 30° is especially suitable for use as a piezoelectric resonator vibrating in c-mode resonance with turnover temperatures ($T_{to}$) above 60° C. The particular angular rotations encompassed within the scope of this invention are referred to herein as AK-cut crystals and are characterized by considerably less sensitivity to crystallographic orientations than the AT-cut, BT-cut or SC-cut quartz crystals presently being utilized to maintain time and resonance frequency standards in timing devices.

Figure 1:
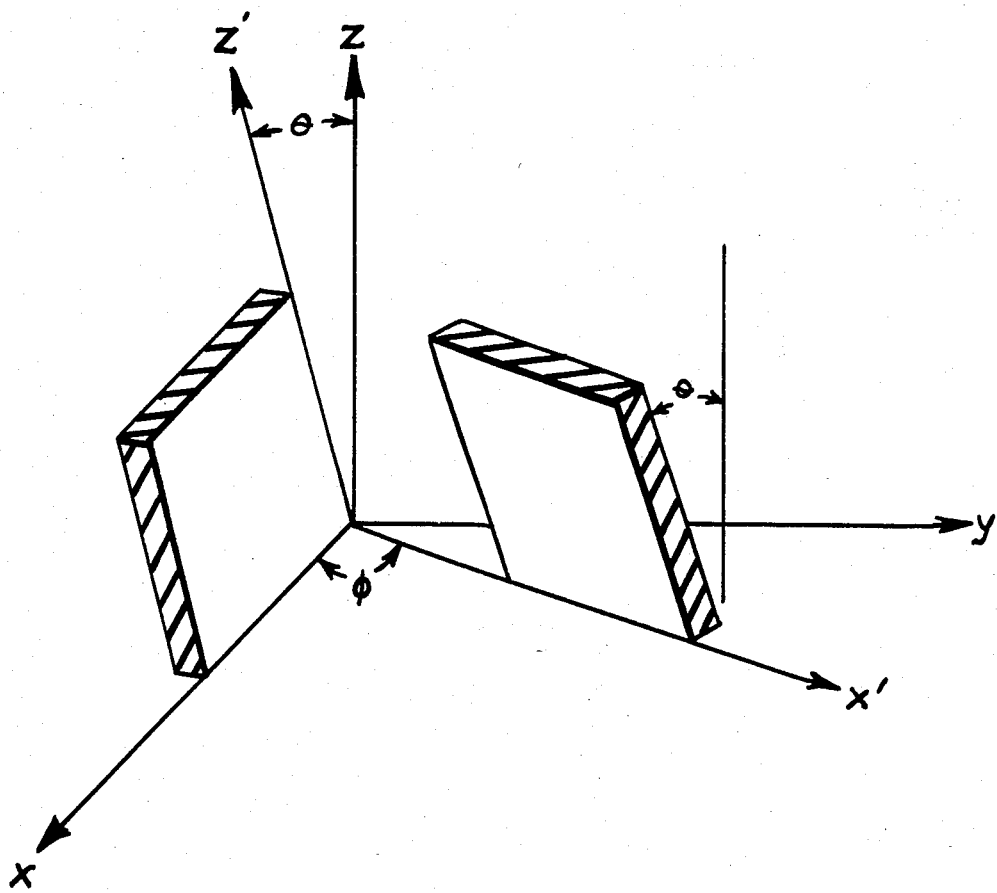
FIG. 1 is a schematic illustration showing the plate geometry and crystallographic coordinate system used in describing the crystal cuts for singly and doubly rotated quartz crystal plates.

Quartz orientations of interest for the transverse mode piezoelectric resonator applications of the invention are rotations around the crystallographic z-axis and/or x-axis. The plate geometry and crystallographic coordinate system used for describing various quartz cuts of this invention is illustrated in FIG. 1. In this method of nomenclature, the orientation of the plate is described by a pair of angles $(\phi,\theta)$ where $\phi$ and $\theta$ are rotations around the z- and x-axis, respectively. In this nomenclature, $\phi$-angle limits are $0° \leq \phi \leq 60°$ and $\theta$-angle rotations are $0° \leq \theta \leq 90°$. The angular rotations associated with the AK-cuts are approximately between $\phi=30°$ and $\phi=60°$, and between $\theta=17°$ and $\theta=30°$. For example, one specific $(\phi,\theta)$ combination is (40.9, 21.0)°. According to this method of nomenclature, the angular rotations of the AT-cut crystal are (0,35), where the first number refers to the $\phi$-angle and the second number to the $\theta$-angle. Both angles are given in degrees. The $\theta$-angle is approximate, and it is a function of the turnover temperature. The family of AK-cut crystals disclosed in this application spans from $\phi=30°$ to 60° and $\theta=17°$ to 30°.

In another method of nomenclature commonly used to note the angular cuts, the $\phi$-angle limits are $0° \leq \phi \leq 30°$ and the $\theta$-angle rotations are $-90° \leq \theta \leq 90°$. The BT-cut is equivalently described then as (60,+49) or (0,−49). The specific angular orientation (40.9, 21.0)° referred to above would be designated as (19.1,−21.0)°. As can be seen, the angle cuts are the same but each carries a different designation depending on the method of nomenclature employed in defining the angle of the crystal cut.

In still a further attempt to describe and clarify the nomenclature utilized in defining the angular rotations of the α-quartz crystals of this invention, it is pointed out that, in general, there are three equivalent notations that have been used to describe angular rotations. One convenient formulation is the coordinate system defined in FIG. 1 of this invention. A second formulation is the notation defined in the old IEEE Standard 176-1949, and the third is the new IEEE Standard 176-1978. The difference between the old and new IEEE Standard is a reversal in the polarity of the X-axis. The notation of FIG. 1 uses the old definition of +X, and was chosen for reference in this invention to avoid the use of negative angles. The following Table gives a direct comparison of the three notations, and for reference purposes also includes some standard cuts, such as AT, BT, SC and RT rotations, as well as a comparison between the cuts recited in each of the claims appended hereto.

TABLE

| Claim | FIG. 1 $(\phi, \theta)$ | IEEE Standard 176-1949 (YXw1) $\phi/\theta$ | | IEEE Standard 176-1978 (YXw1) $\phi/\theta$ | |
|---|---|---|---|---|---|
| | | $\phi$ | $\theta$ | $\phi$ | $\theta$ |
| 1 | (30 to 60, 12 to 32) | 30 to 0 | −12 to −32 | 30 to 0 | 12 to 32 |
| 2 | (30 to 46, 14 to 30) | 30 to 14 | −14 to −30 | 30 to 14 | 14 to 30 |
| 3 | (30.0, 24.44) | 30.0 | −24.44 | 30.0 | 24.44 |
| 4 | (36.58, 28.45) | 23.42 | −28.45 | 23.42 | 28.45 |
| 5 | (46.1, 23.59) | 13.9 | −23.59 | 13.9 | 23.59 |
| 6 | (40.9, 21.0) | 19.1 | −21.0 | 19.1 | 21.0 |
| 7 | (40.9, 23.59) | 19.1 | −23.59 | 19.1 | 23.59 |
| 8 | (40.9, 27.0) | 19.1 | −27.0 | 19.1 | 27.0 |
| 9 | (36.0, 24.44) | 24.0 | −24.44 | 24.0 | 24.44 |
| AT | (0.0, 35.25) | 0.0 | 35.25 | 0.0 | −35.25 |
| BT | (60.0, 49.2) | 0.0 | −49.2 | 0.0 | 49.2 |
| SC | (21.93, 33.93) | 21.93 | 33.93 | 21.93 | −33.93 |
| RT | (45.0, 34.5) | 15.0 | −34.5 | 15.0 | 34.5 |

Figure 2:
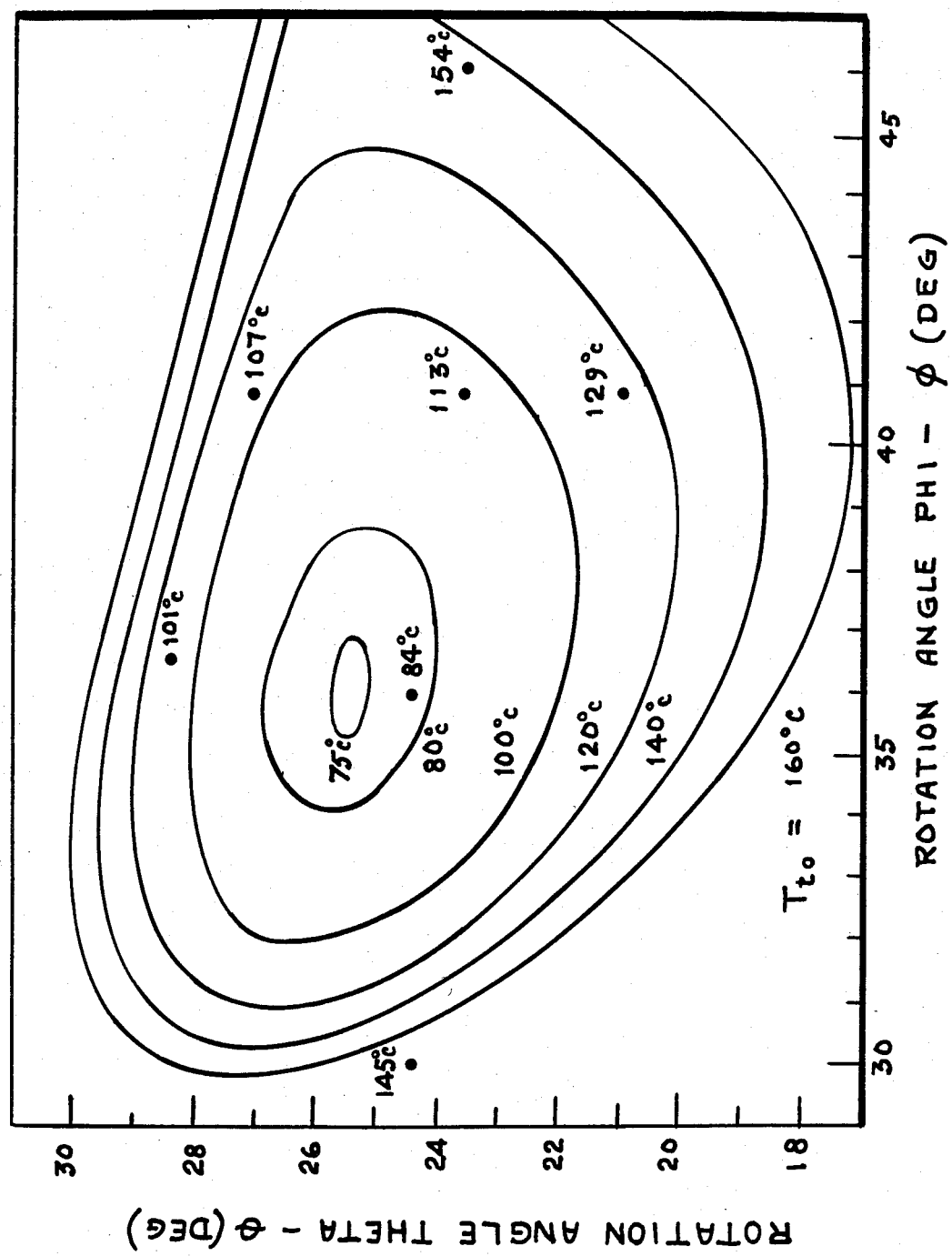
FIG. 2 is a graphical illustration showing the calculated ($\phi,\theta$) loci of selected turnover temperatures $T_{to}$ for the AK-cut crystals of this invention and in which isolines indicate turnover temperatures between 75° C. and 160° C.

FIG. 2 shows the calculated loci of $(\phi,\theta)$ combinations for selected turnover temperatures, $T_{to}$, between 75 and 160° C. of AK-cut c-mode vibrations for the crystals of this invention. These calculations are based on a set of temperature coefficients of elastic constants. Another equivalent set of coefficients give the lowest turnover temperatures as 60° C. The temperature coefficients of the elastic constants which are used for these computations are considered to be valid between −200° C. and +200° C. For AT-cut crystals, $\phi=0°$, the turnover temperatures throughout this temperature range are single value functions of the $\theta$-angle, and are obtained at $\theta$-angles slightly larger than 35.25°. In the 50° C. to 100° C. range, the AT-cut $T_{to}$ shifts by 2.6° C. per minute of arc. The AT-cut angle equivalent to $T_{to}=200°$ C, is $\theta=36.70°$. For AK-cut crystals, the lowest possible $T_{to}$ is approximately 60° C., and for a specified $\phi$-angle there are two $\theta$-angles which give identical $T_{to}$. For a selected $T_{to}$, the $(\phi,\theta)$ loci exhibit concentric quasi-elliptical characteristics, with the angular boundaries increasing with $T_{to}$. The distortions in the $T_{to}=140°$ C. and $T_{to}=160°$ C. curves at the higher $\phi$-angles and upper $\theta$-angle segments are due to the interference of the $T_{to}$ branch containing the AT-type turnover temperatures. The $(\phi,\theta)$ locations of the experimental resonators are shown in FIG. 2 by solid dots, with the experimental $T_{to}$ values indicated for seven orientations, $\phi$-angle variations between 30°–46° and $\theta$-angle variations between 21°–28°, measured on 3.3–3.4 MHz fundamental mode resonators vibrating in the thickness shear c-mode. The experimental turnover temperatures of these resonators are between 80° C. and 150° C.

The primary advantage of AK-cut crystals, that is, the relative insensitivity of $T_{to}$ to inaccuracies in $(\phi,\theta)$, is implicit in the curves shown in FIG. 2. For example, at $\phi=37°$ the tolerance on the $\theta$-angle for the $T_{to}$ to be between 75° C. and 85° C. is $\Delta\theta=\pm1.9°$. In contrast, for the same $T_{to}$ range, the tolerance for the AT-cut is $\Delta\theta=\pm2'$, approximately 60 times more sensitive. The $T_{to}$ position of the b-mode BT-cut ($\phi=60°$) is less sensitive to θ-angle changes than the AT-cut, and the comparable angular tolerance is $\Delta\theta = \pm 14'$.

Figure 3:
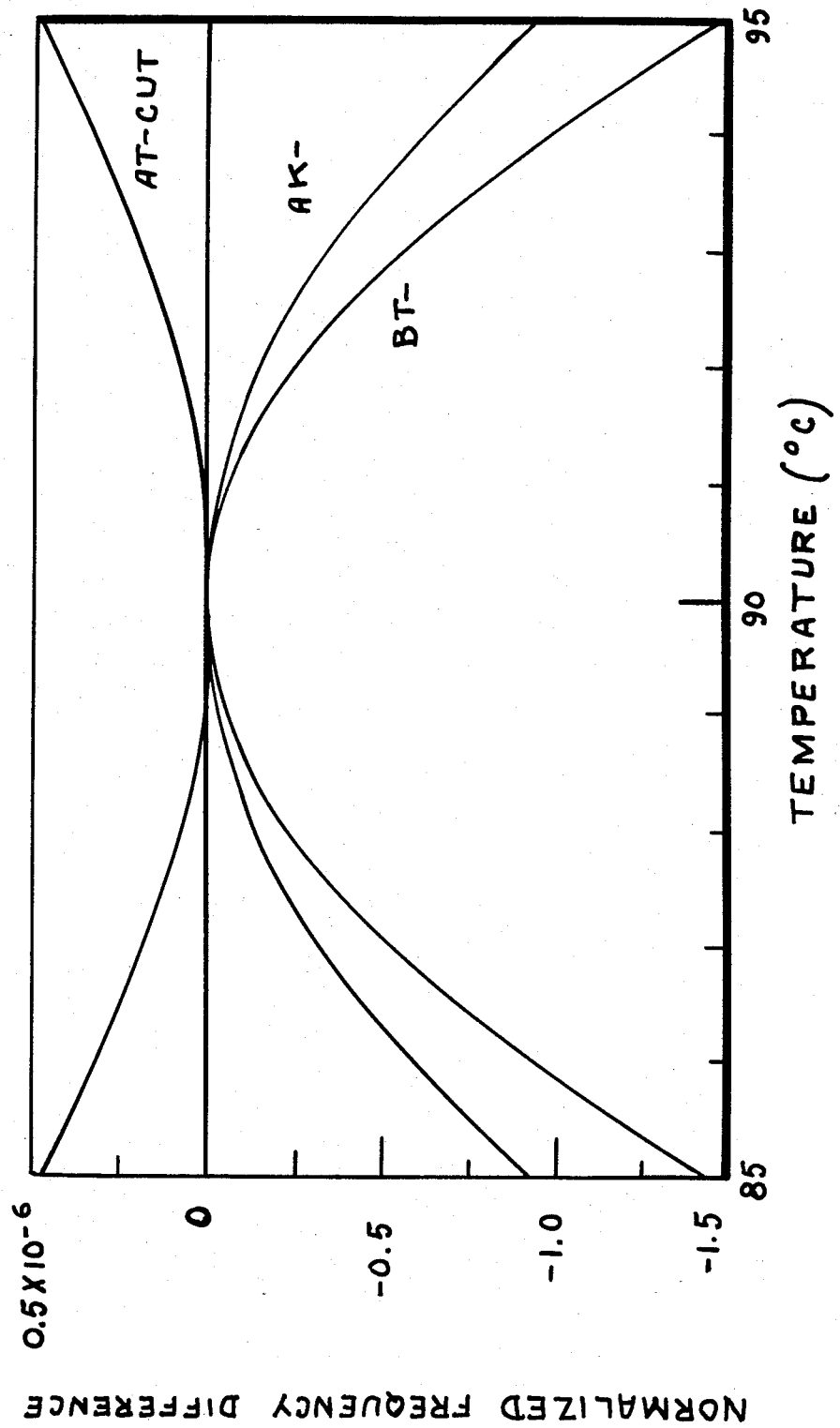
FIG. 3 is a graphical illustration showing the calculated frequency-temperature angle characteristics for an AT- and BT-cut crystals; and the AK-cut crystal of this invention.

FIG. 3 shows a comparison of the frequency change as a function of temperature between 85° and 95° C., for AT-cut and BT-cut, and AK-cut crystals designed for $T_{to} = 90°$ C. The turnover temperature, $T_{to}$, is defined by the zero values of the first order derivative of the frequency-temperature curve. The frequency change at 5° C. from the turnover is approximately 0.5, −1.0, and $−1.5 \times 10^{-6}$ for the AT-cut, AK-cut, and BT-cut crystals, respectively. The frequency as a function of temperature sensitivity of the AK-cut lies in-between the AT-cut and the BT-cut.

Figure 4:
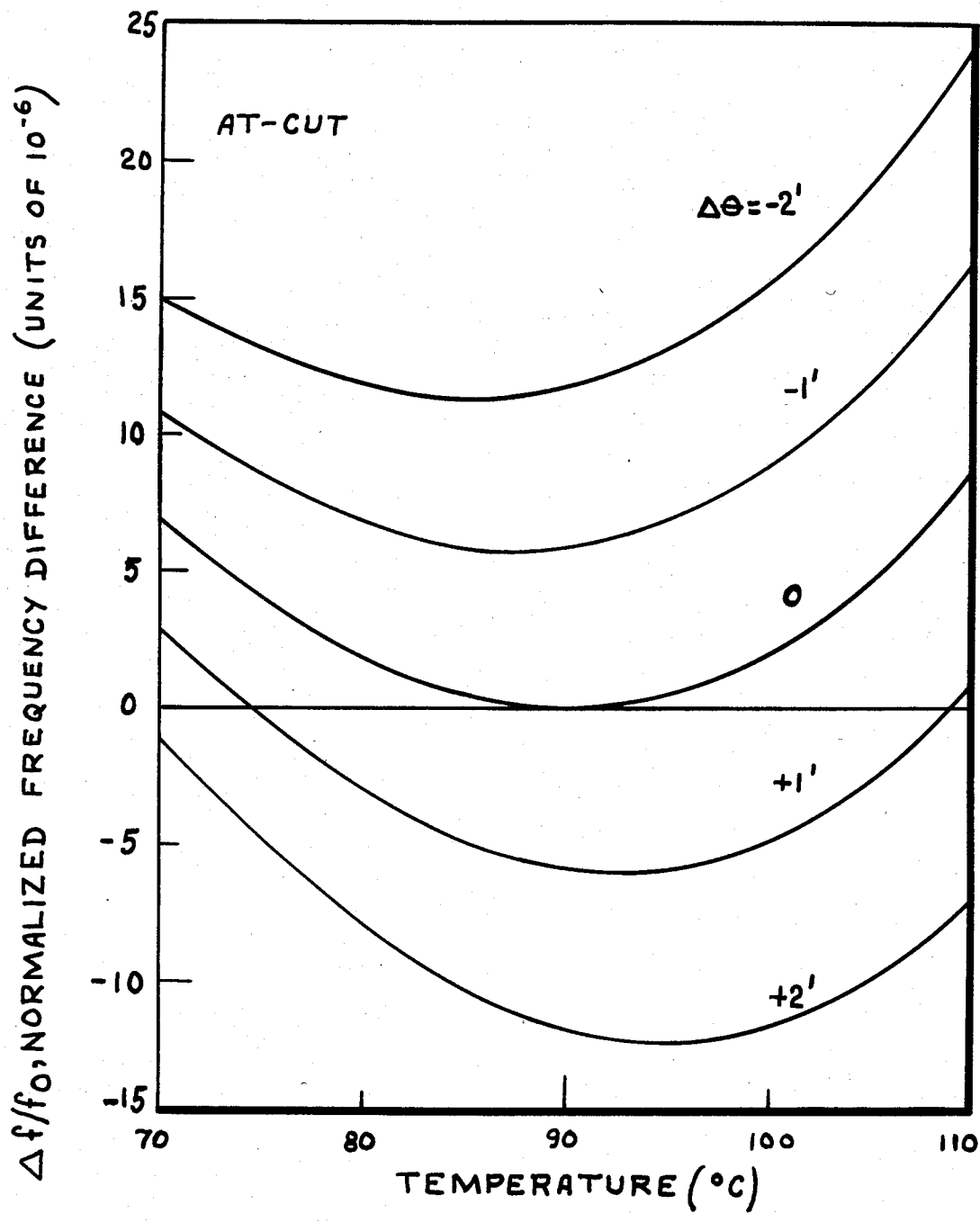
FIG. 4 is a graphical illustration showing the calculated frequency-temperature and angle characteristics for an AT-cut crystal.
Figure 5:
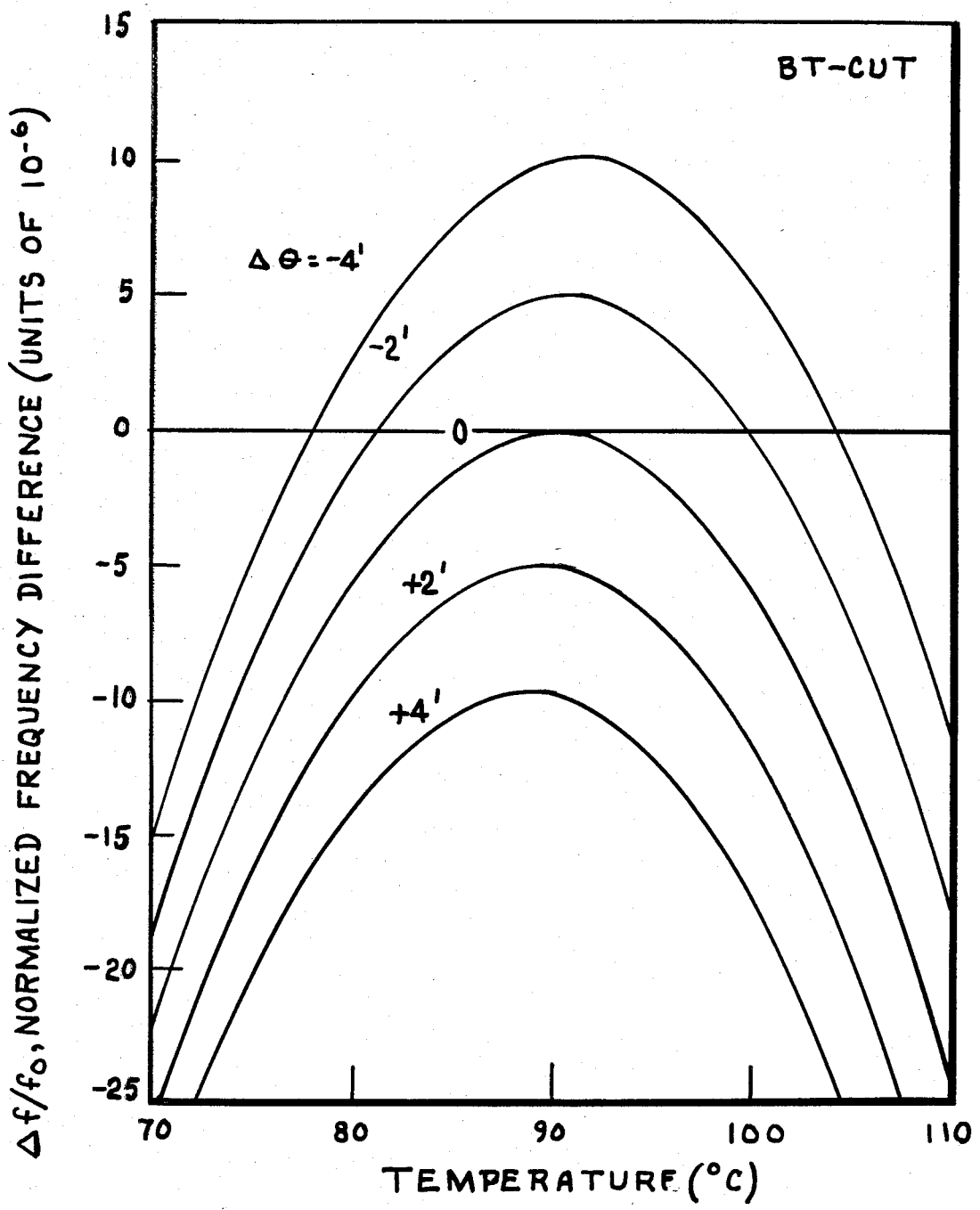
FIG. 5 is a graphical illustration showing the calculated frequency-temperature and angle characteristics for a BT-cut crystal.
Figure 6:
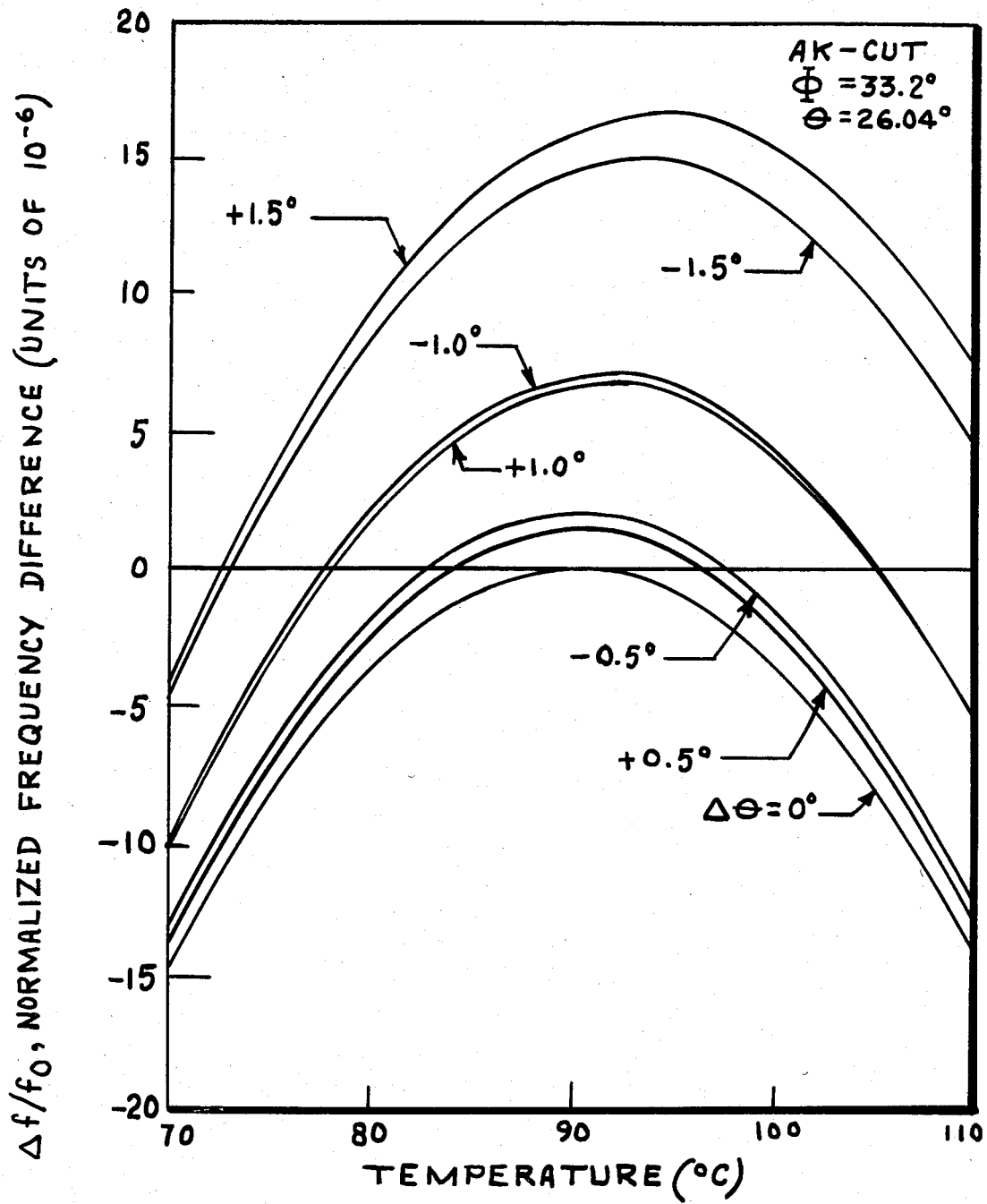
FIG. 6 is a graphical illustration showing the calculated frequency-temperature and angle characteristics for an AK-cut crystal of this invention.
Figure 7F:
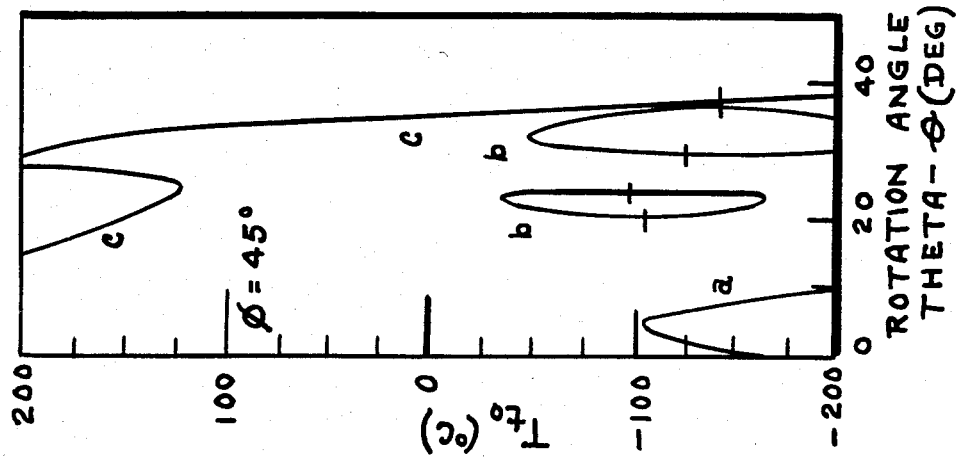
Figure 7E:
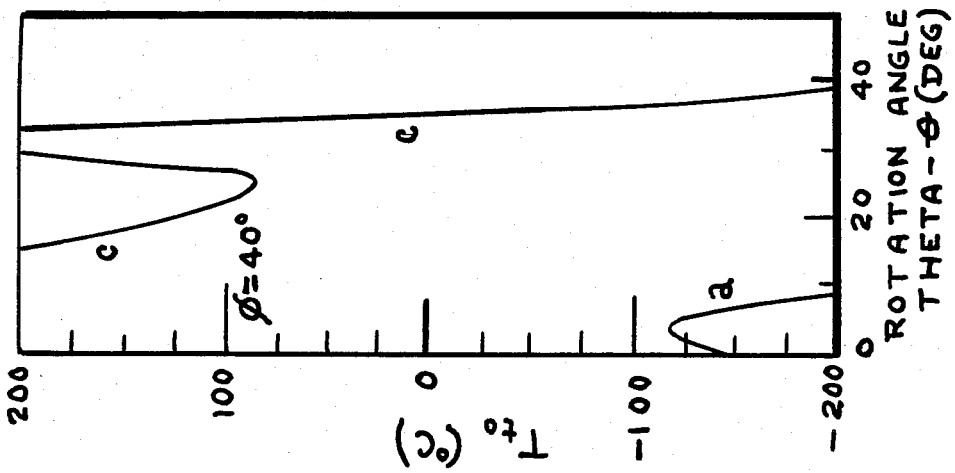
Figure 7D:
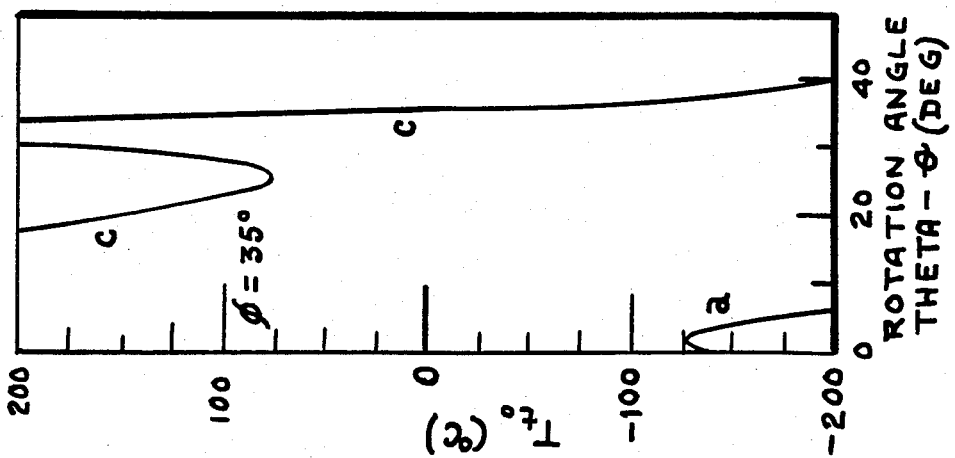
Figure 7I:
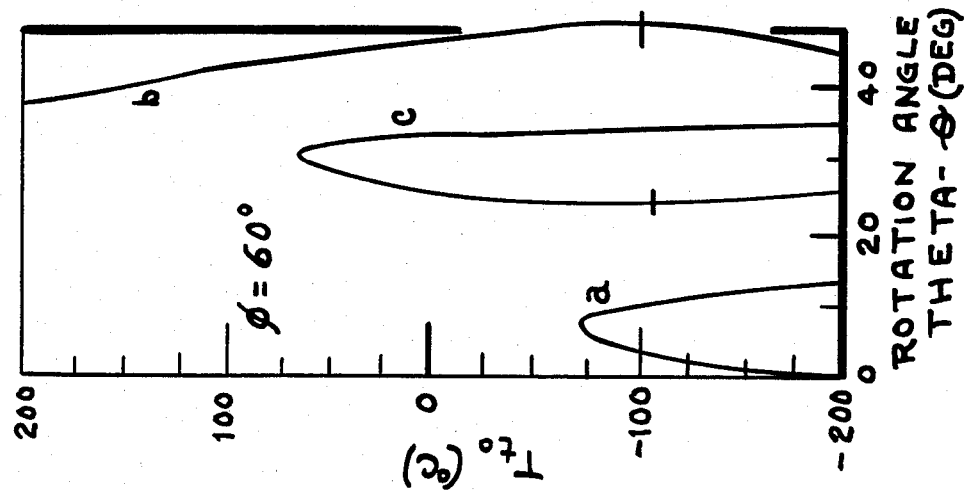
Figure 7H:
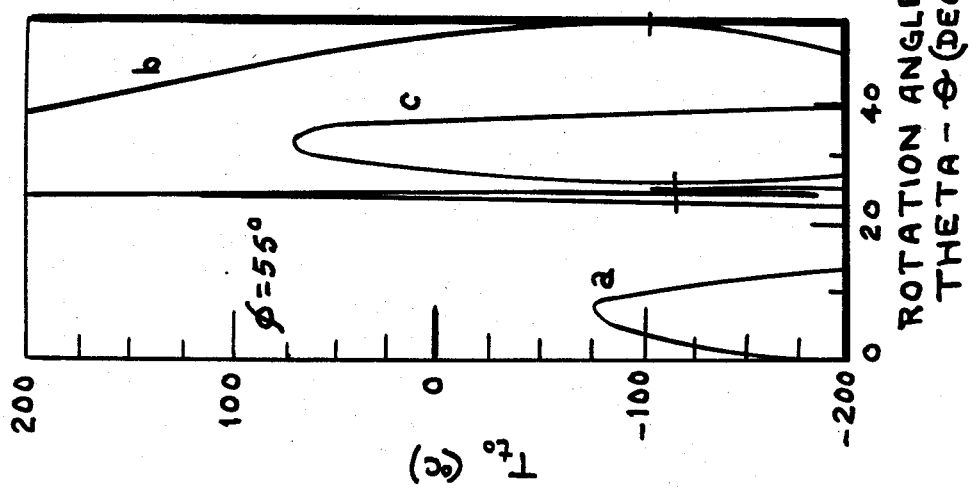
Figure 7G:
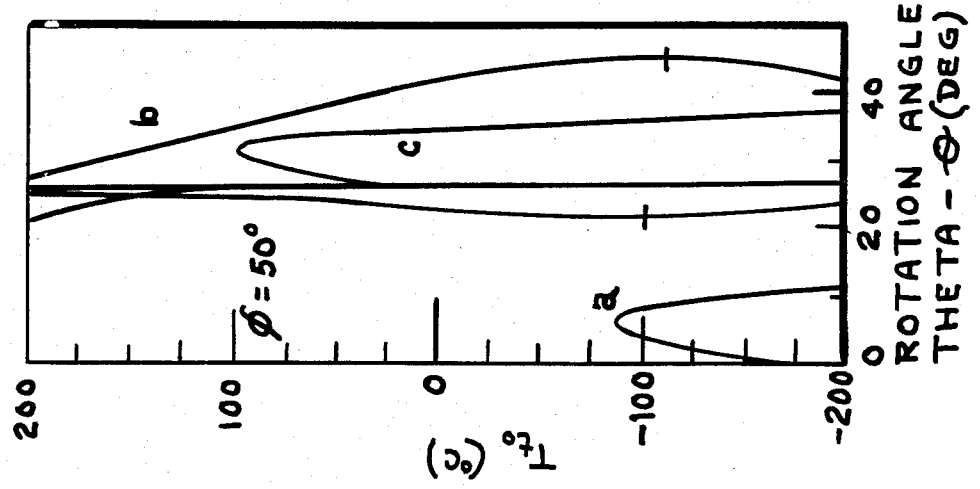

The major advantages of the AK-cut crystals are illustrated in FIGS. 4, 5 and 6. FIG. 4 shows the frequency sensitivity of the AT-cut to θ-angle errors. For one minute of arc deviation in the θ-angle, the frequency error is about $6 \times 10^{31}$ 6 and the turnover temperature shifts by 3-4 degrees. FIG. 5 shows similar calculations for the BT-cut. The BT-cut is less sensitive, approximately a factor of 2, to crystallographic misorientation than the AT-cut. FIG. 6 shows comparative computation for the AK-cut. The calculations indicate that the AK-cut is less sensitive, approximately by a factor of 50, to angular orientation than the standard AT-cut crystal. The potential for obtaining resonator performance equivalent to AT-cut and BT-cut crystals and at the same time relax the angular tolerances in fabricating quartz crystal resonators, or relax the temperature control requirements in using the AK-cut resonator in a temperature controlled crystal oscillator, significantly affects the expense of these devices resulting in significantly lower production costs.

The most important performance parameter or characteristic of a crystal oscillator is its static frequency as a function of temperature. This behavior characteristic will be determined by the values and temperature dependencies of the elastic, piezoelectric, and dielectric constants, and by the expansion coefficients of the material used in fabricating the resonator element. Quartz is the most commonly used piezoelectric resonator crystal material, owing to its superior mechanical, physical, and chemical properties. Quartz belongs to the trigonal crystal system, and material properties are crystallographic orientation dependent. However, certain orientations exist which yield considerably smaller frequency-temperature dependencies than other orientations. For high frequency and high stability applications, the two most widely used orientations are designated as the AT-cut and the BT-cut. The crystallographic orientations for these cuts are approximately (0, ~35) and (60, ~49) respectively.

The primary objective of this invention was to confirm the existence of thickness shear c-mode vibrations yielding turnover temperatures in the 60° C. to 200° C. temperature range for crystallographic orientations which are unrelated to angular values usually associated with the general class of doubly rotated AT-cuts.

Figure 12:
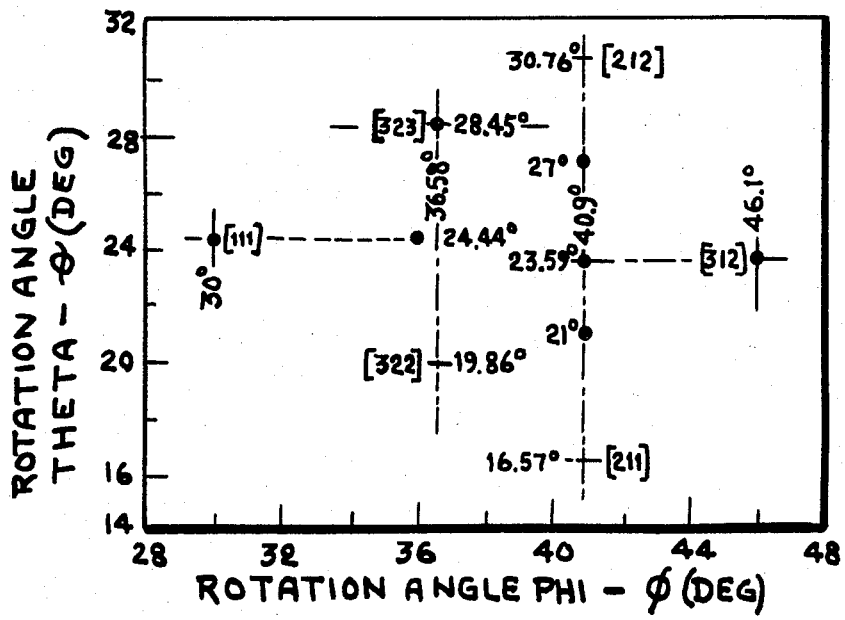
FIG. 12 is a graphical illustration showing rotation angles for a series of AK-cut resonators.

The initial evaluation of the AK-cut crystals comprises seven (φ,θ) orientations. FIG. 12 shows the (φ,θ) positions of the selected cuts, and the Miller indices of the lattice planes associated with this crystallographic region. The primary (φ,θ) selection criterion was ease of orientation and fabrication. Three rotations, (30, 24.44)°, (36.58, 28.45)°, and (46.10, 23.59)° are low index lattice planes [111], [323], and [312], respectively. Another three rotations, (40.9, 21.0)°, (40.9, 23.59)°, and (40.9, 27.0)°, are situated along the [211] and [212] planes, and the seventh (36.0, 24.44)°, is obtained by a 6° rotation from [111]. The crystals were machined into plano-plano plates, beveled at the edges, and the disks were fabricated into 10 MHz, 3rd overtone, resonators using established manufacturing processes. The exact 10 MHz frequency value was not a fabrication requirement.

The fabricated resonators also have turnover temperatures in the fundamental mode, and their $T_{to}$ values are indicated in FIG. 2. Some experimental points lie above, some below, and some almost coincide with predicted values. Considering the simplified mathematical formalism utilized for these computations, and the inaccuracies in the temperature coefficients of the elastic constant values, the general agreement between theory and experiment is surprising and gratifying. Throughout the entire measured temperature range, 25° C. to 145° C., the data is equally well described by the cubic equation set forth hereinafter, and the deviations from the cubic are substantially less than $\pm 1 \times 10^{-6}$. The initial measurements pertained to the 3rd overtone modes, and the corresponding $T_{to}$ values were the ones indicated in FIG. 14 of an article by Kahan cited as Kahan, A. (June 3, 1982) "Turnover Temperatures for Doubly Rotated Quartz", 36th Annual Frequency Control Symposium, 170-180.

In the temperature range of interest for this invention, the normalized frequency offset of a resonator, $\Delta f/f_o$, as a function of temperature T, in the −200° C. to +200° C. range, can be mathematically modeled by a cubic equation expanded around a temperature $T_o$, usually taken at 25° C. and wherein $f_o$ is the frequency at $T_{to} = 25°$ C. The cubic equation is shown in the form below:

$$\frac{\Delta f}{f_o} = \frac{(f - f_o)}{f_o} = a_o(T - T_o) + b_o(T - T_o)^2 + c_o(T - T_o)^3 \quad (I)$$

werein $a_o$, $b_o$, and $c_o$ are 1st, 2nd and 3rd order of temperature coefficients of frequency, respectively.

Depending on the values of $a_o$, $b_o$ and $c_o$, the frequency-temperature curve may exhibit a maximum and a minimum. These positions are designated as the turnover temperature, $T_{to}$. At these positions, the frequency is not very sensitive to temperature offsets. Consequently, one is able to achieve high stabilities by operating the resonator at $T_{to}$. For high stability applications, the resonator device is enclosed in a precisely controlled oven and maintained at $T_{to}$.

Most military applications specify upper environmental temperatures in the 60° to 100° C. range. Therefore, the crystal resonator is designed to operate several degrees above the highest anticipated environmental temperature, and the resonator turnover temperature is designed to coincide with the oven operating temperature. The AT-cut and BT-cut crystals are examples of such designs, and changing the angular cut will shift the turnover temperature. These crystals have been, and are, widely used in all high precision frequency control applications.

Standard commercially available high precision oscillators utilize oven controlled AT-cut or BT-cut resonators operating in the 70°-90° C. temperature range. The problem encountered with these resonators is that the turnover temperature is a sensitive parameter of the crystallographic angles, and that it is necessary that the tolerances throughout the fabrication process of cutting, lapping, polishing and plating, be maintained to 1-2 minutes of arc.

The requirements of precise oven control and crystallographic orientation contribute to the high costs encountered during the manufacture of the crystal resonators. Despite these fabrication restrictions, the technology to manufacture high precision AT-cut and BT-cut resonators is highly developed. The technology to construct the AK-cut resonators of this invention, is identical with AT-cut or BT-cut processes. Any manufacturer fabricating AT-cut or BT-cut resonators can construct the AK-cut crystals of this invention without any change in processing techniques or technology development. The importance of the AK-cut crystal is that it relaxes the manufacturing constraints enabling one to obtain the same performance as current resonators at a substantially lower cost.

The manufacturing techniques for preparing and cutting the crystal resonators of this invention are well known in the resonator art; and, for purposes of enabling the present invention to be brought into effect, reference is made to the conventional resonator manufacturing techniques disclosed in "Crystal Technology", W. L. Bond, John Wiley and Sons, New York (1976) and to "Quartz Crystals for Electrical Circuits", R. A. Heising, D. Van Nostrand and Co., Inc., New York (1946), both of which disclose a number of well known techniques for preparing oscillators and the crystal resonators utilized therein.

Quartz crystals support three modes of transverse vibrations, usually described as the a-mode, b-mode and c-mode. The AT-cut belongs to the c-mode branch and the BT-cut to the b-mode branch. There have been developed a family of doubly rotated crystals, for example, the IT-cut, FC-cut, SC-cut, and RT-cut, each having certain advantages over the singly rotated AT-cut or BT-cut. An extensive review of the mathematical formalism used for these calculations, and descriptions and properties of the various cuts are presented in a review article by A. Ballato, "Doubly Rotated Thickness Mode Plate Vibrations", Physical Acoustics: Principles and Methods, Vol. 13, Chap. 5, W. P. Mason and R. N. Thurston, Editors. New York: Academic Press, pages 115-181 (1977).

A series of calculations, have been performed, following the formalism outlined in the Ballato article. Based on these results, computations for the a-, b-, and c-mode turnover temperature for all possible combinations of $(\phi,\theta)$, have been computed. FIGS. 7a through 7i show the $T_{to}$ results for various $\phi$-angles. Physically significant results are limited to the $-200°$ to $+200°$ C. temperature range, the validity interval of the material constant values used in the computations.

Figure 8:
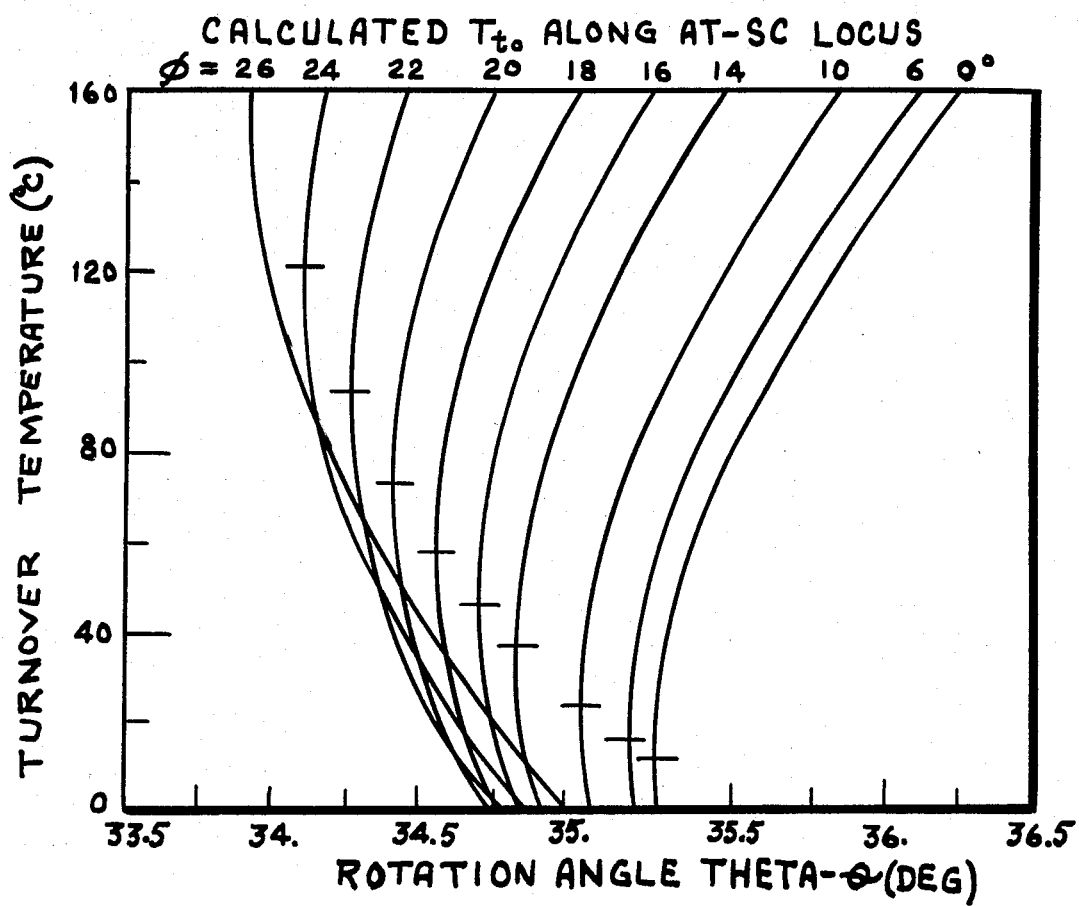
FIGS. 8 and 9 are graphical illustrations showing calculated c-mode turnover temperatures as a function of rotation angles.

FIG. 8 shows the c-mode turnover temperatures between 0° C. and 160° C. and $\phi=0°-26°$ along the AT-, SC-cut locus. The horizontal lines through these curves indicate the lowest value of the $\theta$-angle for which turnover temperatures exist. For optimum frequency-temperature operation, for a specific $T_{to}$, one would select a doubly rotated cut with $T_{to}$ near the lowest $\theta$-angle value. For example, for $T_{to}=80°$ C., the optimum cut would be $\phi=20.71°$ and $\theta=34.33°$. However, the curves are steepest exactly at this $\theta$-angle value, and the slightest deviation in angular orientation introduces drastic errors in $T_{to}$. A similar set of curves, with similar conclusions, can be constructed for the BT-cut between $\phi=50°-60°$.

A closer examination of FIGS. 7a to 7i indicates that for the same mode of vibration, starting approximately at $\phi=26°$, $T_{to}$ is not a single valued function. For the same $\phi$-angle the same turnover temperatures can be obtained by several angles. For example, for $\phi=35°$ and $T_{to}=85°$ C. in addition to the usual $\theta\sim33°$, we note a plateau at $\theta=20°-25°$.

Figure 9:
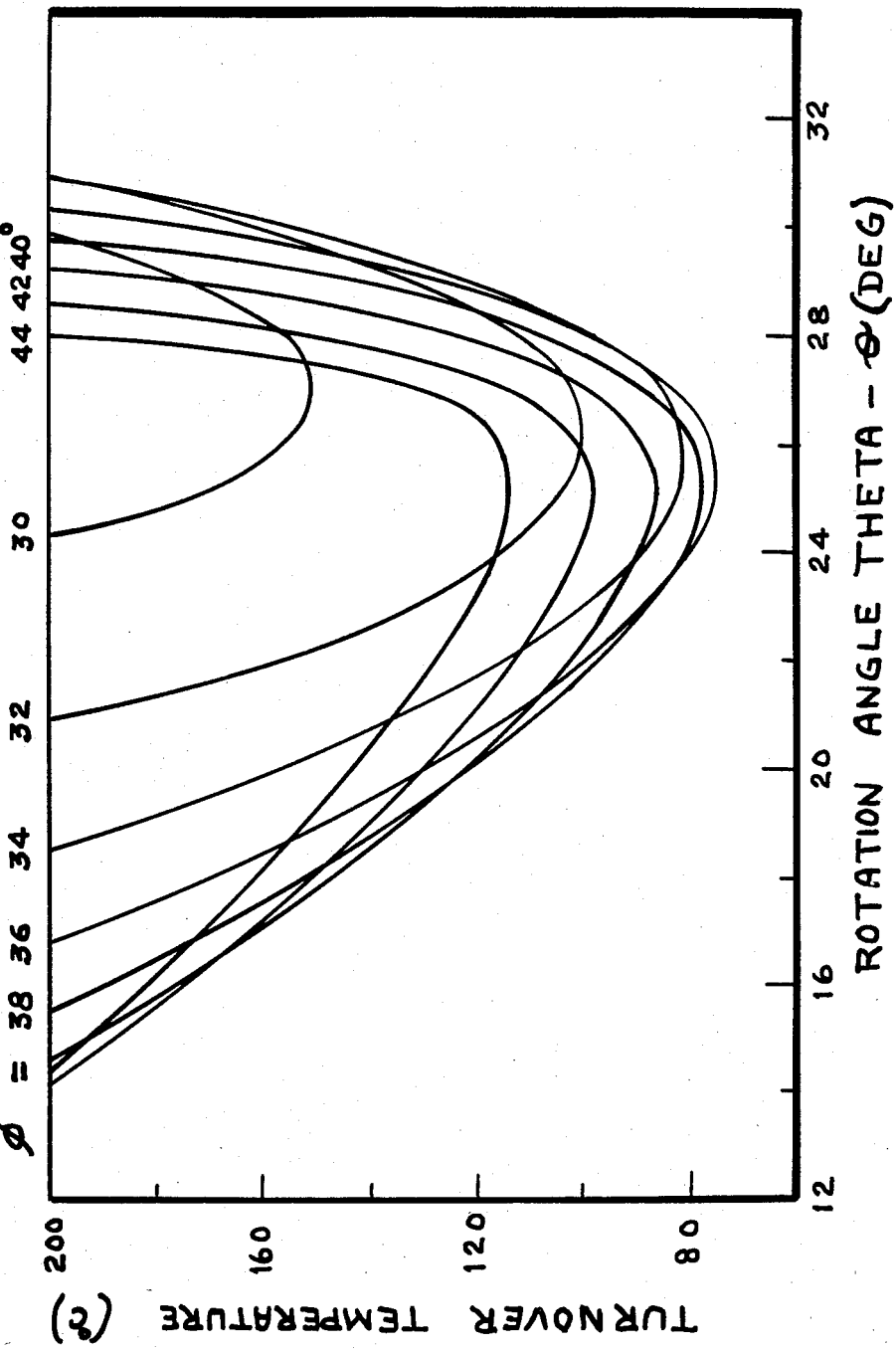

FIG. 9 shows $T_{to}$ as a function of $\theta$ for $\phi=30°-44°$. The angular combinations of the plateau region, yielding $T_{to}$ in the same temperature range as the AT-cut, is designated as the family of AK-cut crystals.

It is known that the formalism utilized for these calculations is not exact and that the material properties used in the computations are not accurate. Consequently, crystal resonator properties can be predicted with great accuracy. Actual $T_{to}$ values may vary wnd it will also depend on the overtone. The exact angular dependence for the AK-cut will have to be determined experimentally.

The frequency as a function of temperature behavior of the AK-cuts crystal, shown for $T_{to}=90°$ C. in FIG. 3, is only slightly affected by the different $(\phi,\theta)$ combinations. This flexibility allows us to (1) choose a particular $(\phi,\theta)$ which minimizes both angular errors and produces a high intensity X-ray reflection to ease positioning requirements, and/or (2) optimize the combination for some other resonator property, for example, electromechanical coupling coefficients, or b- to c-mode frequency separation.

For the AK-cut crystal, the b-mode and c-mode separation at $T_{to}=90°$ C. is calculated to be in-between 7% and 14% depending on the chosen $(\phi,\theta)$ combination. The frequency-thickness constant for the AK-cut is calculated as 1.9-2.0 MHz-mm, compared to 1.66 and 2.53 MHz-mm for the AT-cut and BT-cut, respectively. Based on these calculations it is expected that the other electrical parameters of a resonator fabricated from an AK-cut crystal will be similar to AT-cut or BT-cut resonators.

Figure 10:
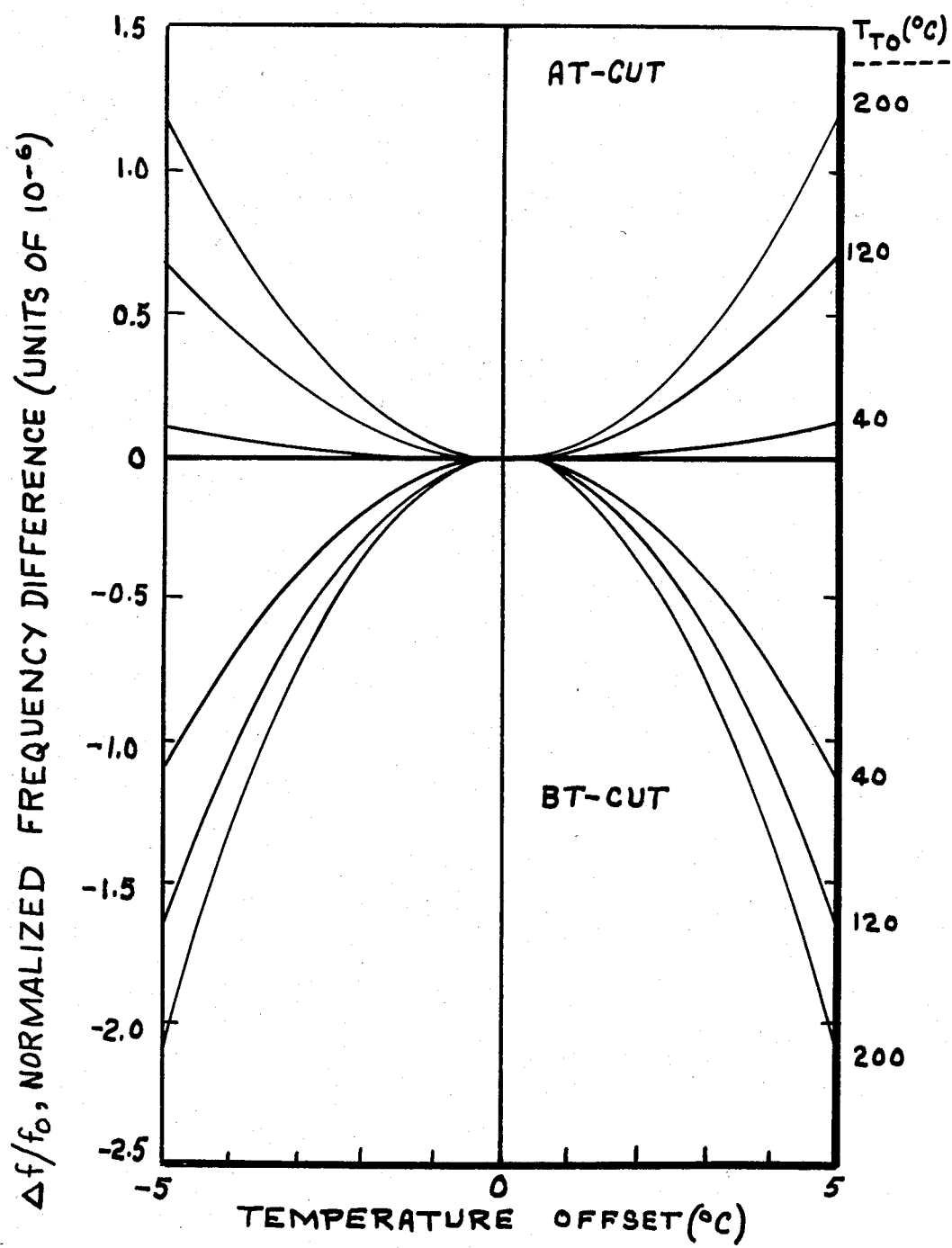
FIG. 10 is a graphical illustration showing calculated frequency offset for AT- and BT-cut crystals at various turnover temperatures.
Figure 11:
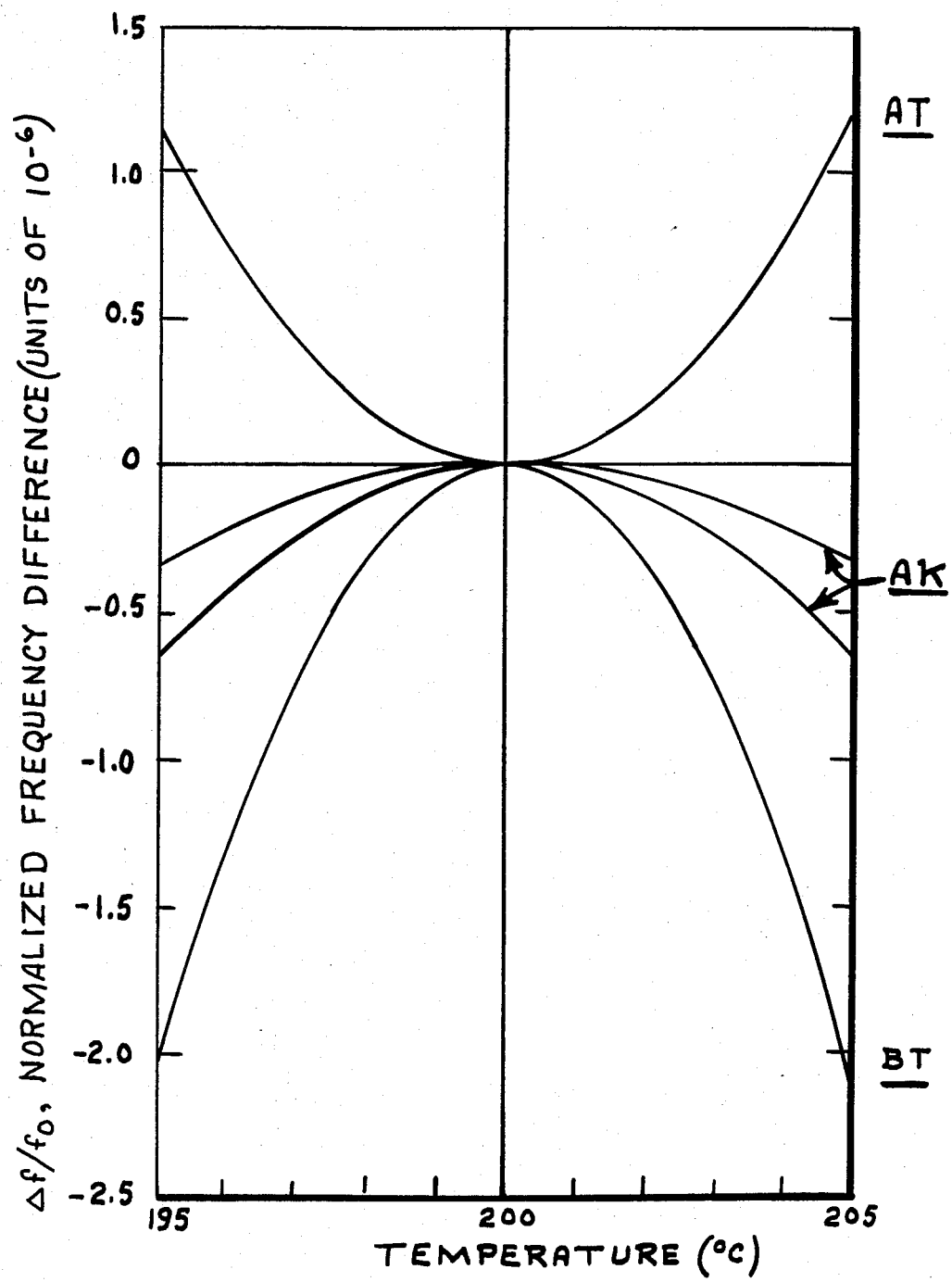
FIG. 11 is a graphical illustration showing calculated frequency-temperature characteristics for various cuts at a turnover temperature of 200° C.

In some applications, both civilian and military, one requires turnover temperatures higher than the usual 80°-90° C. The frequency-temperature performance of the AK-cut crystals are superior to either the AT-cut or the BT-cut at these higher turnover temperatures. FIG. 10 illustrates the calculated frequency as a function of temperature characteristic of AT-cut and BT-cut crystals designed for $T_{to}=40°$, 120°, and 200° C. The higher $T_{to}$, the steeper the frequency-temperature curve and more sensitive the resonator. FIG. 11 shows comparative results for AK-cut, AT-cut, and BT-cut crystals for $T_{to}=200°$ C. At 5° C. from the turnover, the frequency offset of the AK-cut, AT-cut and BT-cut crystals are approximately $-0.3$, 1.2, and $-2.1\times10^{-6}$, respectively. This improved performance for the AK-cut crystal is again achieved with wide angular tolerances.

From an examination of the aforementioned description, it can be seen that the present invention provides crystal oscillators and resonators that are unexpectedly efficient and useful for maintaining time and frequency standards in a number of electronic applications. They are specifically useful for military navigation, surveillance, identification, and communication for command and control systems. Crystal oscillators are critical navigation system device elements. Synchronized clocks are used to time the arrival of radio signals from ground, airborne, and spaced deployed beacons. Timing is an integral part of navigation, and position error is directly related to time offset. A more stable time base such as that achieved by the present invention, leads to more accurate navigation. In communication systems, the number of channels for any given bandwidth is determined by the available frequency precision. Increased frequency control provides flexibility in designing secure, high-speed, time ordered transmission circuits. Timing devices provide synchronization between network nodal points and improved standards reduce errors associated with bit integrity and periodic recalibration. In secure identification systems, the critical performance criteria, the length of the code validity interval, is determined by the accuracy and stability of the crystal oscillator used in the system.

The output frequency of an oscillator is derived from the crystal resonator incorporated in the device. In most applications, the accuracy, stability, and sensitivity of the oscillator to environmental effects are determined by the crystal resonator. The major cause of oscillator frequency offset and time error is frequency-temperature characteristics of the resonator device. Near the turnover temperature, the frequency is only slightly affected by the temperature and for high stability applications it is desirable to operate the device at the turnover temperature. The resonator is maintained at the turnover temperature by enclosing it in a precisely controlled oven, or even double and triple ovens. The turnover temperature is selected to be several degrees above the highest anticipated environmental temperature. For most military applications, specifications include environmental temperature of 80° C. and above. The turnover temperature is a sensitive function of crystallographic orientations, and precise angular tolerances have to be maintained throughout the resonator fabrication process. Both requirements, crystallographic orientation and precise oven control, considerably affect oscillator cost. The AK-cut crystal will be capable of achieving the same performance level as currently used AT-cut or BT-cut crystals, and at the same time relax, by factors 20-50, crystallographic tolerances or oven control requirements.

The novelty of this discovery is that it shows the existence of specific combinations of $(\phi,\theta)$ angular orientation which have turnover temperatures of 60° C. and above, possess equivalent or better temperature-frequency characteristics than high precision AT-cut or BT-cut resonators presently used and, at the same time, be insensitive to crystallographic misorientations.

Consequently, a crystal oscillator having the stability and reliability achieved by using the crystals of this invention contributes immeasurably to the overall increased efficiency of the timing devices used in the above referred to systems. In addition, the incorporation of the AK-cut crystal of this invention into a resonator or oscillator will reduce the cost of these devices making them more readily available for use.

While the invention has been described by reference to particular embodiments, it should be understood by those skilled in the art to which the subject matter of this invention pertains, that the invention is capable of being altered or modified, and that all such modifications as are embodied in the appended claims are intended to be included herein.

I claim:

1. A crystal resonator comprising a thin, quartz plate vibrating in a thickness shear c-mode resonance and (A) having a doubly rotated crystallographic orientation around (1) the z-axis of said plate by an angle phi ($\phi$) ranging from about 30° to 60° and (2) the x-axis of said plate by an angle theta ($\theta$) ranging from about 12° to 31.92°; and (B) said crystalline resonator further characterized by having turnover temperatures in the range of about 60° C. to 200° C.

2. A crystal resonator in accordance with claim 1 wherein the angle phi ($\phi$) is in the range of about 30° to 46° and the angle theta ($\theta$) is about 14° to 30°.

3. A crystal resonator in accordance with claim 2 wherein the angles $(\phi,\theta)$ are about (30.0,24.44)°.

4. A crystal resonator in accordance with claim 2 wherein the angles $(\phi,\theta)$ are about (36.58,28.45)°.

5. A crystal resonator in accordance with claim 2 wherein the angles $(\phi,\theta)$ are about (46.10,23.59)°.

6. A crystal resonator in accordance with claim 2 wherein the angles $(\phi,\theta)$ are about (40.9,21.0)°.

7. A crystal resonator in accordance with claim 2 wherein the angles $(\phi,\theta)$ are about (40.9,23.59)°.

8. A crystal resonator in accordance with claim 2 wherein the angles $(\phi,\theta)$ are about (40.9,27.0)°.

9. A crystal resonator in accordance with claim 2 wherein the angles $(\phi,\theta)$ are about (36.0,24.44)°.

* * * * *